United States Patent [19]

Tanaka et al.

[11] Patent Number: 4,944,893
[45] Date of Patent: Jul. 31, 1990

[54] REMOVER SOLUTION FOR RESIST

[75] Inventors: Hatsuyuki Tanaka, Samukawa; Masakazu Kobayashi, Kawasaki; Kazumasa Wakiya, Samukawa; Toshimasa Nakayama, Hiratsuka, all of Japan

[73] Assignee: Tokyo Ohka Kogyo Co., Ltd., Kawasaki, Japan

[21] Appl. No.: 243,001

[22] Filed: Sep. 12, 1988

[30] Foreign Application Priority Data

Sep. 16, 1987 [JP] Japan .................................. 62-229648

[51] Int. Cl.$^5$ .............................................. C09D 9/00
[52] U.S. Cl. .................................... 252/171; 252/170; 134/38
[58] Field of Search .................... 252/170, 171; 134/38

[56] References Cited

U.S. PATENT DOCUMENTS 3,988,256 10/1976 Vandermey et al. ............... 252/171

Primary Examiner—Paul Lieberman
Assistant Examiner—John F. McNally
Attorney, Agent, or Firm—Armstrong, Nikaido, Marmelstein, Kubovcik & Murray

[57] ABSTRACT

The remover composition of the invention is advantageous in respect of the thermal stability without precipitation of insoluble matters when the remover is used prolongedly in a removing work of patterned resist, e.g., photoresist, layer in the manufacturing process of semiconductor devices. The inventive remover composition characteristically contains 1 to 50,000 ppm by weight of an acetylene alcohol such as 3-methyl-2-butyn-3-ol added to an organic remover solution composed of an alkylbenzene sulfonic acid, phenol compound, halogenated hydrocarbon compound and/or aromatic hydrocarbon compound.

7 Claims, 1 Drawing Sheet

FIGURE
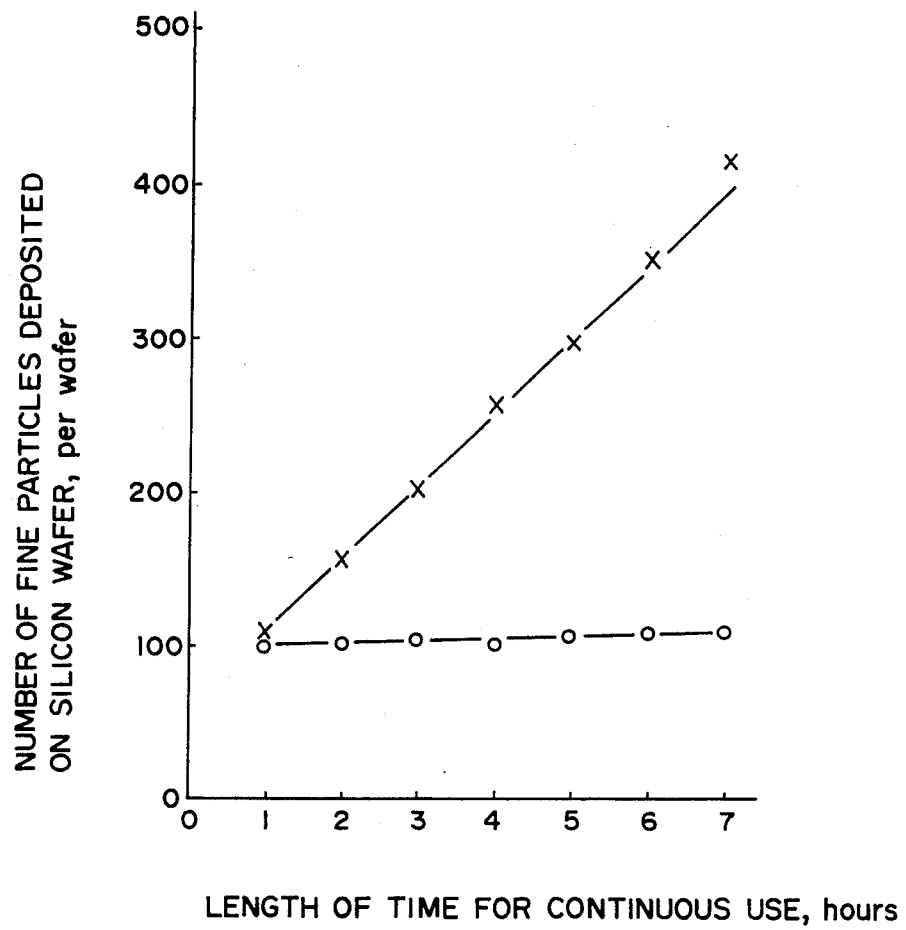

REMOVER SOLUTION FOR RESIST

BACKGROUND OF THE INVENTION

The present invention relates to a remover solution for resist or, more particularly, to a remover solution which can be used with stability in the removing works of resist in the manufacturing process of semiconductor devices without the disadvantage of formation of insoluble matters even when the solution is used in a continuous removing treatment of resist.

As is well known, the manufacturing process of semiconductor devices such as ICs and LSIs generally involves the successive steps in which a substrate of, for example, semiconductor silicon wafer is first provided on the surface with a thin film such as oxide film, then the surface is coated uniformly with a resist in the form of a solution to form a resinous layer sensitive to actinic rays, the resist layer is exposed pattern-wise to actinic rays followed by a development treatment to form a patterned resist layer, the underlying thin oxide film is subjected to pattern-wise etching with the patterned resist layer as the mask against etching and finally the patterned resist layer is removed completely. The resist having sensitivity to actinic rays implied in the present invention include photoresists, electron-beam resists, X-ray resists and the like.

The above mentioned last step of removal of the resist is performed conventionally by using an inorganic remover liquid such as hot concentrated sulfuric acid, fuming nitric acid, mixture of sulfuric acid and hydrogen peroxide and the like. These remover liquids are of course very dangerous to the human body and the danger is increased greatly when the remover is used at a high temperature requiring utmost care in handling of the remover. Moreover, these strongly acidic removers have a disadvantage that not only the patterned resist layer is removed thereby but also the underlying metallic layer which should not be dissolved away is not safe from the attack by the remover. In this regard, it is a trend in recent years that the inorganic removers are increasingly replaced with an organic remover formulated by using various organic solvents.

Various types of organic remover solutions have been proposed including mixtures of organic solvents such as phenol, halogenated hydrocarbons and the like and a surface active agent such as alkylbenzene sulfonic acid and the like, mixtures of an alkylbenzene sulfonic acid of which the overall number of the carbon atoms in a molecule is 10 to 20 and a nonhalogenated aromatic hydrocarbon solvent having a boiling point of 150° C. or higher as disclosed in Japanese Patent Kokai 51-72503, mixtures of a surface-active alkyl aryl sulfonic acid of which the overall number of the carbon atoms in a molecule is 10 to 20, a hydrotropic aromatic sulfonic acid of which the overall number of the carbon atoms in a molecule is 6 to 9 and a non-halogenated aromatic hydrocarbon solvent having a boiling point of 150° C. or higher as disclosed in U.S. Pat. No. 4,165,294, polar or non-polar organic solvents admixed with effective amounts of 1,2-dihydroxy benzene and an organic sulfonic acid as disclosed in European Patent Publication No. 01 19 337, mixtures composed of 30 to 70% by weight of one, or a combination of aromatic hydrocarbons having a flash point of 70° C. or higher containing at least 50% by weight of one or more of naphthalene compounds including naphthalene, methyl naphthalene and dimethyl naphthalene, 5 to 40% by weight of one or more of phenol compounds and 10 to 50% by weight of an aryl sulfonic acid as disclosed in Japanese Patent Kokai 62-35357, and so on.

These organic remover solutions are more and more widely used in recent years replacing conventional inorganic ones by virtue of their advantages that they are less dangerous than inorganic ones and have an excellent corrosion-preventing activity for layers of a metal such as aluminum formed on the substrate. When such an organic remover solution is used continuously at a high temperature of, for example, 100° C or higher as is usually the case in order to obtain a removing activity suitable for practical use in the removing treatment of a resist, a disadvantage is sometimes caused that insoluble matters are precipitated in the remover solution and deposited on the substrate surface. Accordingly, it is not a sufficient condition for a remover solution that the patterned resist layer can be completely removed from the substrate surface thereby but it is essential that no insoluble matters are deposited on the substrate surface since otherwise the remover solution cannot be used in practice due to lack of stability.

SUMMARY OF THE INVENTION

The present invention accordingly has an object to provide a novel and improved organic remover solution having excellent thermal stability and freed from the above described problems and disadvantages in the conventional organic remover solutions.

Thus, the remover solution for a resist provided by the present invention is an organic remover solution admixed with an acetylene alcohol, preferably, in an amount in the range from 1 to 50,000 ppm by weight.

BRIEF DESCRIPTION OF THE DRAWING

The figure is a graph showing the number of fine particles deposited on the surface of a semiconductor silicon wafer in the removing treatment in Example 1 by using an inventive remover (the curve plotted with o) and a comparative remover (the curve plotted with x) as a function of the length of time for which each remover was used.

DETAILED DESCRIPTION OF THE PREFERRED EMBODIMENTS

As is described above, the characteristic feature of the inventive remover is the addition of an acetylene alcohol to an organic remover solution. The organic remover solution which is used as a base component of the inventive remover is not particularly limitative provided that the principal ingredient thereof is an organic solvent or a combination of organic solvents including known ones mentioned above. Examples of the preferable constituents of the organic remove solution include alkyl benzene sulfonic acids of which the total number of carbon atoms in a molecule is 7 to 20 such as ethyl benzene ethyl benzene sulfonic acid, trimethyl benzene sulfonic acid, propyl benzene sulfonic acid, cumene sulfonic acid, hexyl benzene sulfonic acid, heptyl benzene sulfonic acid, octyl benzene sulfonic acid, decyl benzene sulfonic acid, dodecyl benzene sulfonic acid, tridecyl benzene sulfonic acid, tetradecyl benzene sulfonic acid and the like. A more preferable organic remover is one of the above named alkyl benzene sulfonic acids admixed with a phenolic compound and a halogenated hydrocarbon compound or an aromatic hydrocarbon compound.

The phenolic compound above mentioned is exemplified by phenol, halogenated phenols, catechol, cresol, xylenol, 4-tertbutyl phenol, 4-tert-butyl catechol, nonyl phenol and the like. The halogenated hydrocarbon compound and aromatic hydrocarbon compound are exemplified by 1,2,3-trichloropropane, dichloropentane, hexyl chloride, 1,2-dibromoethane? chlorobenzene, 1,2- dichlorobenzene, trichlorobenzene, bromobenzene, 1,2-dibromobenz 2-chlorotoluene and other halogenated hydrocarbon compounds and naphthalene, methyl naphthalene, dimethyl naphthalene, tetrahydronaphthalene, dodecyl benzene, di(dodecyl)benzene, octyl benzene, decyl benzene, isopropyl naphthalene, diisopropyl naphthalene and other aromatic hydrocarbon compounds. These compounds can be used either singly or as a combination of two kinds or more according to need.

The acetylene alcohol added to the above described organic remover to give the inventive remover solution is a compound represented by the general formula $R^1$—$C(CH_3)(OH)$—$C\equiv C$—$R^2$, in which $R^1$ is a methyl group, n-alkyl group of the formula $CH_3$-$(CH_2)_n$-, in which n is a positive integer of 1 to 5, or isobutyl group and $R^2$ is a hydrogen atom or a group expressed by the formula —$C(CH_3)(OH)$-$(CH_2)_m$-$CH_3$ or —$C(CH_3)(OH)$ -$(CH_2)_m$-$CH(CH_3)_2$, in which m is zero or a positive integer not exceeding 5.

Examples of suitable acetylene alcohol include 3-methyl-1-butyn-3-ol, 3-methyl-1-pentyn-3-ol, 2,5-3,6-dimethyl-4-octyn-3,6-diol, 2,4,7,9-tetramethyl-5-decyn—4,7-diol, 3,5-dimethyl-1-hexyn-3alcohols can be used either singly or as a combination of two kinds or more according to need. Among the above named acetylene alcohols, 3-methyl-1-butyn-3-ol and 3-methyl-1-pentyn-3-ol are particularly preferable in respect of the high effectiveness in achieving the object of the present invention. Several commercial products of acetylene alcohols are available including Surfynols and Olfines (products by Air Products and Chemicals Co., Inc.) as the preferable examples in respect of the availability.

The remover composition of the present invention can be obtained by adding the above mentioned acetylene alcohol to an organic remover solution. The amount of the acetylene alcohol added to the organic remover solution is in the range from 1 to 50,000 ppm by weight or, preferably, from 10 to 10,000 ppm by weight of the organic remover solution. When the amount of the acetylene alcohol is too small, the object of the present invention cannot be achieved as a matter of course. When the amount of the acetylene alcohol is increased over the above mentioned upper limit, no further additional advantageous effect can be obtained thereby rather with an economical disadvantage due to the increase in the costs. Moreover, the length of time taken for complete removal of the patterned resist layer by using the remover is disadvantageously increased as a trend.

In the following, formulations of the inventive remover composition and the effectiveness thereof are described in detail by way of examples.

EXAMPLE 1

A semiconductor silicon wafer of 4-inches diameter was coated with a commercial product of positive-working photoresist composition (OFPR-800, a product by Tokyo Ohka Kogyo Co.) in a coating thickness of 3.0 μm as dried and dried by heating at 110° C. for 90 seconds on a hot plate. In the next place, the photoresist layer was exposed pattern-wise to ultraviolet light through a photomask followed by development and then subjected to a post-baking treatment at 140° C. for 5 minutes on a hot plate to give a silicon wafer having a patterned resist layer on the surface. Seven silicon wafers each having a patterned photoresist layer were prepared in the above described manner.

A remover composition according to the invention was prepared by adding 100 ppm by weight of 3-methyl-1-pentyn-3-ol (Olfine P, a product by Air Products and Chemicals, Inc.) to an organic remover solution composed of 60% by weight of 1,2-dichlorobenzene, 20% by weight of phenol and 20% by weight of dodecylbenzene sulfonic acid with agitation. The seven silicon wafers having a patterned photoresist layer prepared above were immersed one by one in 5000 ml of the remover composition with 1 hour of the time of immersion for each of the seven silicon wafers. The silicon wafers after the above described removing treatment of the photoresist layer were each rinsed by dipping successively in a fluorocarbon solvent, ethyl alcohol and water followed by drying.

The numbers of the fine particles deposited on the surface of the seven silicon wafers obtained one by one in the above described removing treatment were counted by using a laser-beam surface inspector (Model HLD-300A, manufactured by Hitachi Electronic Engineering Co.) to give the results shown in the figure of the accompanying drawing as a function of the accumulated length of time for the removing treatment in the same remover bath. The number of fine particles is taken as the ordinate and the length of treatment time is taken as the abscissa. The figure also shows the results obtained in a comparative test undertaken in the same manner as above but using a remover solution without addition of the acetylene alcohol.

As is clear from the results of these experiments, the remover solution of the invention is very advantageous because almost no increase is noted in the number of the fine particles deposited on the substrate surface even after prolonged continuous use along with absence of insoluble matters precipitated in the solution. On the contrary, the conventional remover solution is not practically usable because of the increase in the number of the fine particles deposited on the substrate surface as the length of time for the continuous use of the remover is extended.

EXAMPLES 2 TO 8 AND COMPARATIVE EXAMPLES 1 AND 2.

Remover solutions were prepared each in the formulation indicated in the table below with addition of an acetylene alcohol in Examples 2 to 8 and without addition of an acetylene alcohol in Comparative Examples 1 and 2. The acetylene alcohols added to the remover solutions and listed in the table are characterized as follows.

Olfine B; 3-methyl-1-butyn-3-ol, a product by Air Products and Chemicals, Inc. Co.

Olfine P: supra

Surfynol 104: 2,4,7,9-tetramethyl-5-decyn-4,7-diol, a product by Air Products and Chemicals, Inc.

Surfynol 61: 3,5-dimethyl-1-hexyn-3-ol, a product by Air Products and Chemicals, Inc.

Each of the thus prepared remover solutions was subjected to the test for removing a patterned photoresist on a silicon wafer in the same manner as in Example 1 to evaluate the practical performance thereof in terms of the number of fine particles deposited on the wafer surface. The results were that each of the remover solutions prepared in Examples 2 to 8 was quite satisfactory with almost no increase in the number of the deposited fine particles even after 7 hours of continued use while the remover solutions prepared in Comparative Examples 1 and 2 were each less satisfactory due to the remarkable increase in the number of the deposited fine particles after 7 hours of continued use in the removing works.

TABLE

|  |  | Base formulation of remover | | Acetylene alcohol | |
|---|---|---|---|---|---|
|  |  | Compound | % by weight | Compound | Amount added, ppm |
| Example | 2 | 1,2-Dichlorobenzene | 60 | Olfine/B | 250 |
|  |  | Phenol | 20 |  |  |
|  |  | Dodecylbenzene sulfonic acid | 20 |  |  |
|  | 3 | 1,2-Dichlorobenzene | 60 | Olfine/B | 500 |
|  |  | Phenol | 20 |  |  |
|  |  | Dodecylbenzene sulfonic acid | 20 |  |  |
|  | 4 | 1,2-Dichlorobenzene | 60 | Surfynol/ | 1000 |
|  |  | Phenol | 104 |  |  |
|  |  | Dodecylbenzene sulfonic acid | 20 |  |  |
|  | 5 | 1,2-Dichlorobenzene | 60 | Olfine/P | 2000 |
|  |  | Phenol | 20 |  |  |
|  |  | Dodecylbenzene sulfonic acid | 20 |  |  |
|  | 6 | 1,2-Dichlorobenzene | 60 | Olfine/P | 5000 |
|  |  | Phenol | 20 |  |  |
|  |  | Dodecylbenzene sulfonic acid | 20 |  |  |
|  | 7 | Dodecylbenzene sulfonic acid | 15 | Surfynol/61 | 10000 |
|  |  | Xylene sulfonic acid | 10 |  |  |
|  |  | Nonyl phenol | 20 |  |  |
|  |  | Naphthalene | 30 |  |  |
|  |  | Methyl naphthalene | 25 |  |  |
|  | 8 | Dodecylbenzene sulfonic acid | 15 | Olfine/P | 1000 |
|  |  | Xylene sulfonic acid | 10 |  |  |
|  |  | Nonyl phenol | 20 |  |  |
|  |  | Solvesso 200* | 55 |  |  |
| Comparative Example | 1 | 1,2-Dichlorobenzene | 60 | None | — |
|  |  | Phenol | 10 |  |  |
|  |  | Dodecylbenzene sulfonic acid | 30 |  |  |
|  | 2 | Dodecylbenzene sulfonic acid | 15 | None | — |
|  |  | Xylene sulfonic acid | 10 |  |  |
|  |  | Nonyl phenol | 20 |  |  |
|  |  | Solvesso 200* | 55 |  |  |

*A mixture of 50% by weight of naphthalene, methyl naphthalene and/or dimethyl naphthalene and 50% by weight of other aromatic hydrocarbon compounds, a product by Exxon Chemical Japan Co.

What is claimed is:

1. A remover composition for a resist which comprises, in an add mixture;
    (a) an organic remover solution comprising an alkylbenzene sulfonic acid having 7 to 20 carbon atoms and at least one compound selected from the group consisting of phenols halogenated hydrocarbons and aromatic hydrocarbons; and
    (b) an actylene alcohol in an amount from 1 to 50,000 ppm by weight based on the organic remover solution.

2. The remover composition for resist as claimed in claim 1 wherein the alkylbenzene sulfonic acid is selected from the group consisting of ethylbenzene sulfonic acid, methylethylbenzene sulfonic acid trimethylbenzene sulfonic acid, propylbenzene sulfonic acid, cumene sulfonic acid, hexylbenzene sulfonic acid, heptylbenzene sulfonic acid, octylbenzene sulfonic acid, decylbenzene sulfonic acid, dodecylbenzene sulfonic acid, tridecylbenzene sulfonic acid and tetradecylbenzene sulfonic acid.

3. The remover composition for resist as claimed in claim 1 wherein the phenol compound is selected from the group consisting of phenol, halogenated phenols, catechol, cresols, xylenols, 4-tert-butyl phenol, 4-tert-butyl catechol and nonyl phenol.

4. The remover composition for resist as claimed in claim 1 wherein the halogenated hydrocarbon compound is selected from the group consisting of 1,2,3-trichloropropane, dichloropentane, hexyl chloride, 1,2-dibromoethane, chlorobenzene, 1,2-dichlorobenzene, trichlorobenzene, bromobenzene, 1,2-dibromobenzene and 2-chlorotoluene.

5. The remover composition for resist as claimed in claim 1 wherein the aromatic hydrocarbon compound is selected from the group consisting of naphthalene, methyl naphthalene, dimethyl naphthalene, tetrahydronaphthalene, dodecyl benzene, di(dodecyl)benzene, octyl benzene, decyl benzene, isopropyl naphthalene and diisopropyl naphthalene.

6. The remover composition for resist as claimed in claim 1 wherein the acetylene alcohol is selected from the group consisting of 3-methyl-1-butyn-3-ol, 3-methyl-1-pentyn-3-ol, 2,5- dimethyl-3-hexyn-2,5-diol, 3,6-dimethyl-4-octyn-3,6-diol, 2,4,7,9-tetramethyl-5-decyn-4,7-diol and 3,5-dimethyl-1-hexyn- 3-ol.

7. The remover composition for resist as claimed in claim 1 wherein the amount of the acetylene alcohol is in the range from 10 to 10,000 ppm by weight based on the organic remover solution.

* * * * *